(12) United States Patent
Daubenspeck et al.

(10) Patent No.: US 9,633,962 B2
(45) Date of Patent: Apr. 25, 2017

(54) PLUG VIA FORMATION WITH GRID FEATURES IN THE PASSIVATION LAYER

(71) Applicant: GLOBALFOUNDRIES INC., Grand Cayman (KY)

(72) Inventors: Timothy H. Daubenspeck, Colchester, VT (US); Jeffrey P. Gambino, Westford, VT (US); Ekta Misra, Fishkill, NY (US); Christopher D. Muzzy, Burlington, VT (US); Wolfgang Sauter, Avon, CO (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 435 days.

(21) Appl. No.: 14/048,483

(22) Filed: Oct. 8, 2013

(65) Prior Publication Data

US 2015/0097283 A1  Apr. 9, 2015

(51) Int. Cl.
*H01L 21/44* (2006.01)
*H01L 23/00* (2006.01)
(Continued)

(52) U.S. Cl.
CPC .......... *H01L 24/11* (2013.01); *H01L 21/7684* (2013.01); *H01L 21/76877* (2013.01); *H01L 24/03* (2013.01); *H01L 24/05* (2013.01); *H01L 24/13* (2013.01); *H01L 25/0657* (2013.01); *H01L 2224/03009* (2013.01); *H01L 2224/0345* (2013.01); *H01L 2224/0347* (2013.01); *H01L 2224/0361* (2013.01); *H01L 2224/03462* (2013.01); *H01L 2224/03602* (2013.01); *H01L 2224/03912* (2013.01); *H01L 2224/0401* (2013.01); *H01L 2224/05007* (2013.01); *H01L 2224/05009* (2013.01); *H01L 2224/05022* (2013.01); *H01L 2224/05023* (2013.01); *H01L 2224/0558* (2013.01); *H01L 2224/05096* (2013.01); *H01L 2224/05124* (2013.01); *H01L 2224/05147* (2013.01); *H01L 2224/05568* (2013.01); *H01L 2224/05655* (2013.01); *H01L 2224/11* (2013.01); *H01L 2224/11009* (2013.01); *H01L 2224/1147* (2013.01); *H01L 2224/11462* (2013.01); *H01L 2224/11849* (2013.01); *H01L 2224/13023* (2013.01);
(Continued)

(58) Field of Classification Search
CPC ......... H01L 2224/0401; H01L 2924/14; H01L 25/0657
USPC .......................................................... 257/737
See application file for complete search history.

(56) References Cited

U.S. PATENT DOCUMENTS 5,374,503 A   12/1994  Sachdev et al.
5,470,693 A   11/1995  Sachdev et al.
(Continued)

*Primary Examiner* — Marc Armand
*Assistant Examiner* — Tifney Skyles
(74) *Attorney, Agent, or Firm* — Thompson Hine LLP; Anthony Canale

(57) ABSTRACT

Solder bump connections and methods for fabricating solder bump connections. A passivation layer is formed on a dielectric layer. Via openings extend through the passivation layer from a top surface of the passivation layer to a metal line in the passivation layer. A conductive layer is formed on the top surface of the passivation layer and within each via opening. When the passivation layer and the conductive layer are planarized, a plug is formed that includes sections in the via openings. Each section is coupled with the metal line.

17 Claims, 7 Drawing Sheets

(51) Int. Cl.
*H01L 21/768* (2006.01)
*H01L 25/065* (2006.01)

(52) U.S. Cl.
CPC . *H01L 2224/13111* (2013.01); *H01L 2224/94* (2013.01); *H01L 2924/14* (2013.01)

(56) References Cited

U.S. PATENT DOCUMENTS

| | | | |
|---|---|---|---|
| 5,795,826 A | 8/1998 | Gambino et al. | |
| 6,109,775 A | 8/2000 | Tripathi et al. | |
| 6,333,560 B1 | 12/2001 | Uzoh | |
| 6,573,187 B1 | 6/2003 | Chen et al. | |
| 6,633,084 B1 | 10/2003 | Sandhu et al. | |
| 6,701,774 B2 | 3/2004 | Srinivasan et al. | |
| 6,833,323 B2 | 12/2004 | Yui et al. | |
| 6,930,034 B2 | 8/2005 | Colburn et al. | |
| 6,958,247 B2 | 10/2005 | Marxsen et al. | |
| 7,281,408 B2 | 10/2007 | Srinivasan et al. | |
| 7,494,912 B2 * | 2/2009 | Coolbaugh | H01L 24/11 257/E21.508 |
| 7,786,584 B2 * | 8/2010 | Barth | H01L 21/76898 257/758 |
| 7,919,844 B2 | 4/2011 | Ozguz et al. | |
| 8,025,625 B2 | 9/2011 | Allen | |
| 8,143,689 B2 | 3/2012 | Warsop et al. | |
| 8,373,275 B2 | 2/2013 | Daubenspeck et al. | |
| 8,438,710 B2 | 5/2013 | Li | |
| 2002/0014106 A1 | 2/2002 | Srinivasan et al. | |
| 2004/0139784 A1 | 7/2004 | Srinivasan et al. | |
| 2006/0241354 A1 | 10/2006 | Allen | |
| 2007/0035033 A1 | 2/2007 | Ozguz et al. | |
| 2011/0038493 A1 | 2/2011 | Li | |
| 2011/0115088 A1 | 5/2011 | Lo et al. | |
| 2012/0016207 A1 | 1/2012 | Allen | |
| 2014/0225258 A1 * | 8/2014 | Chiu | H01L 23/49816 257/738 |

* cited by examiner

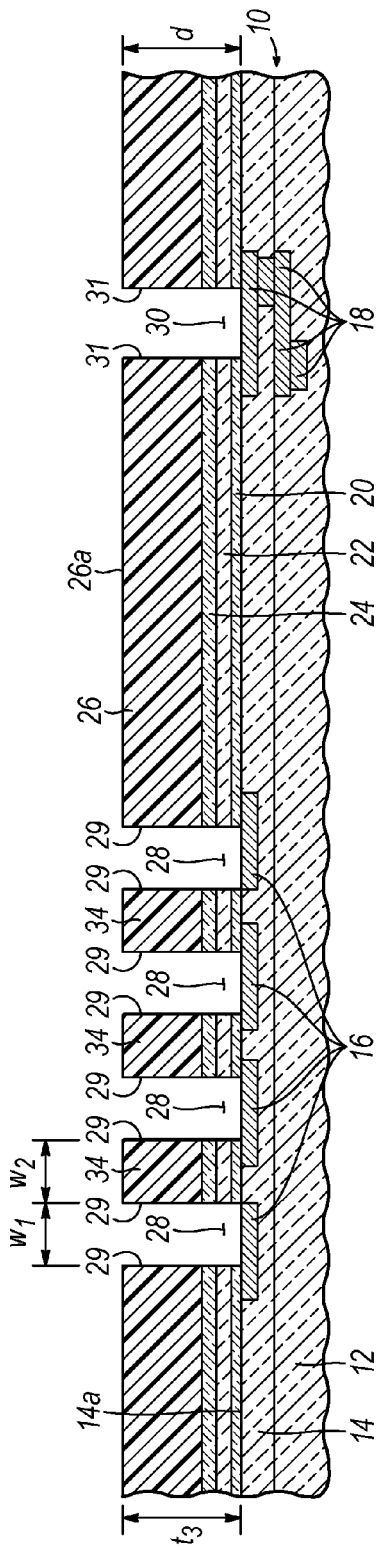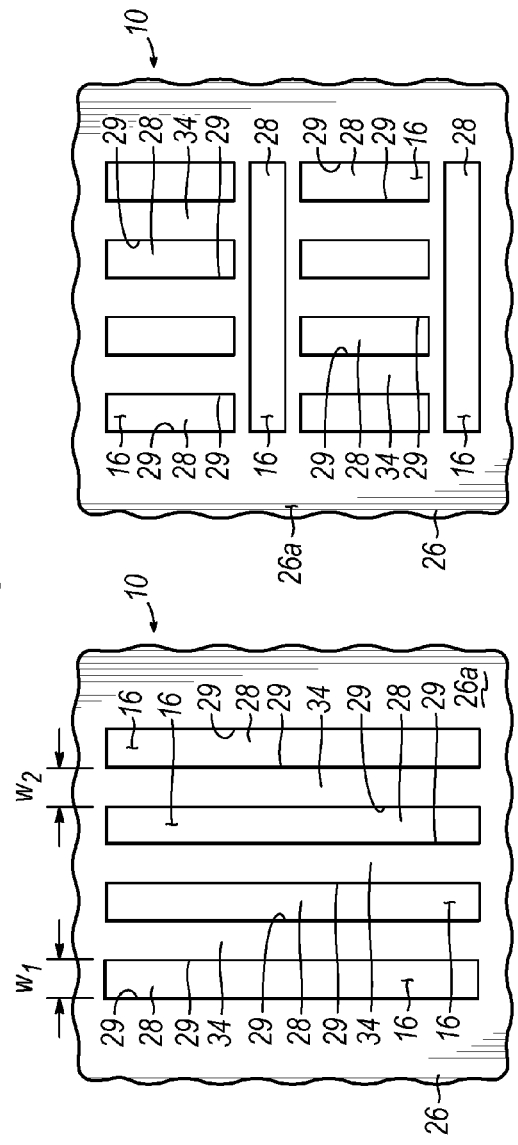
FIG. 1
FIG. 2
FIG. 2A

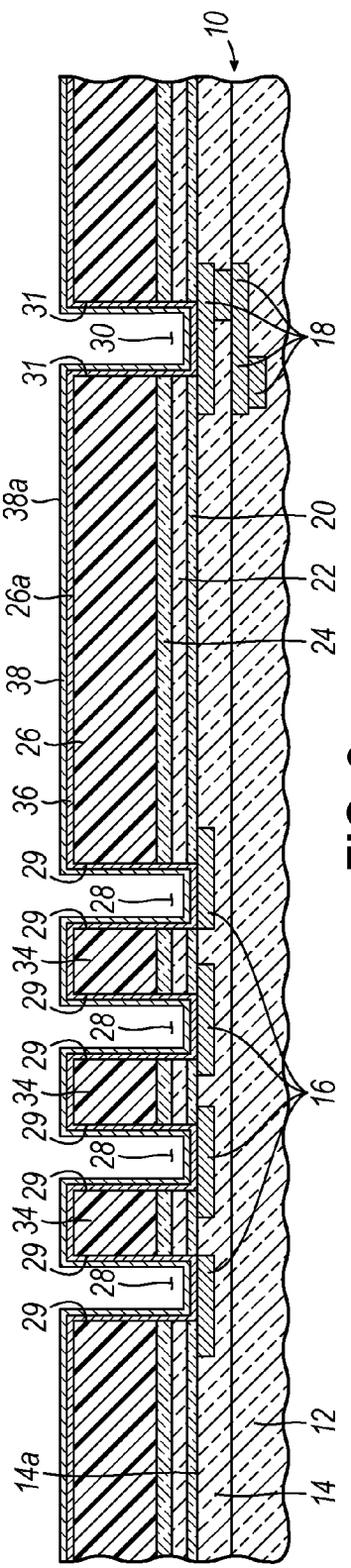
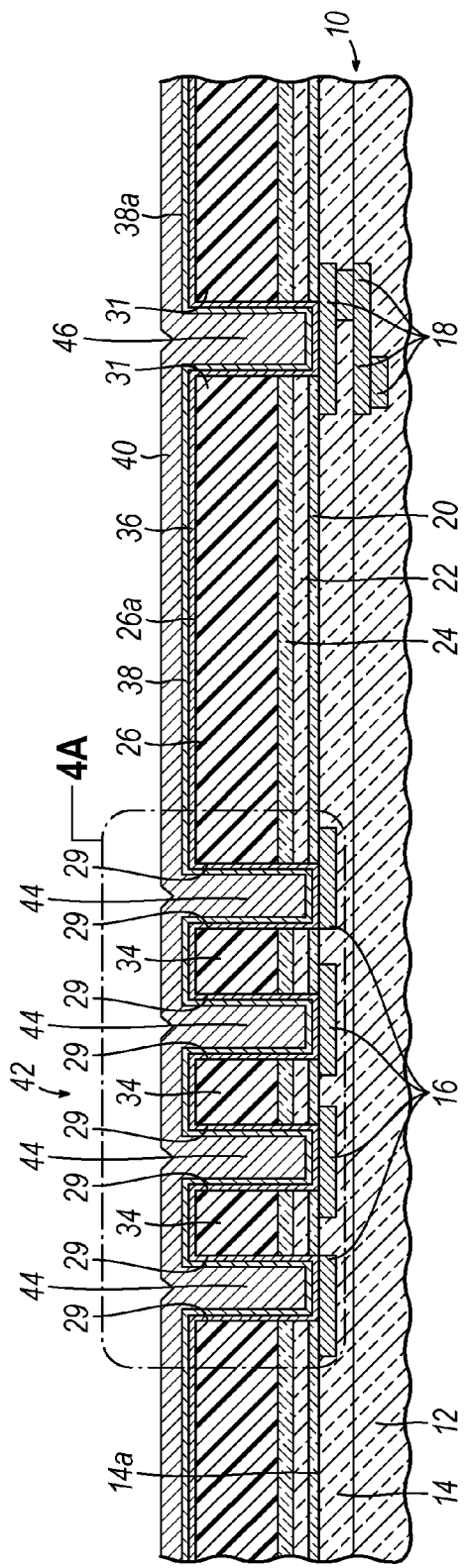

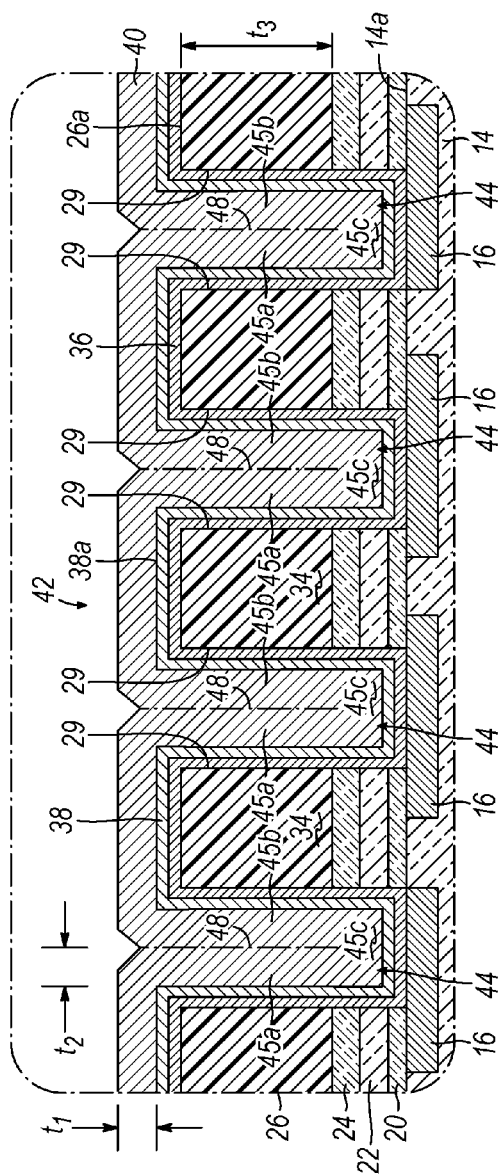
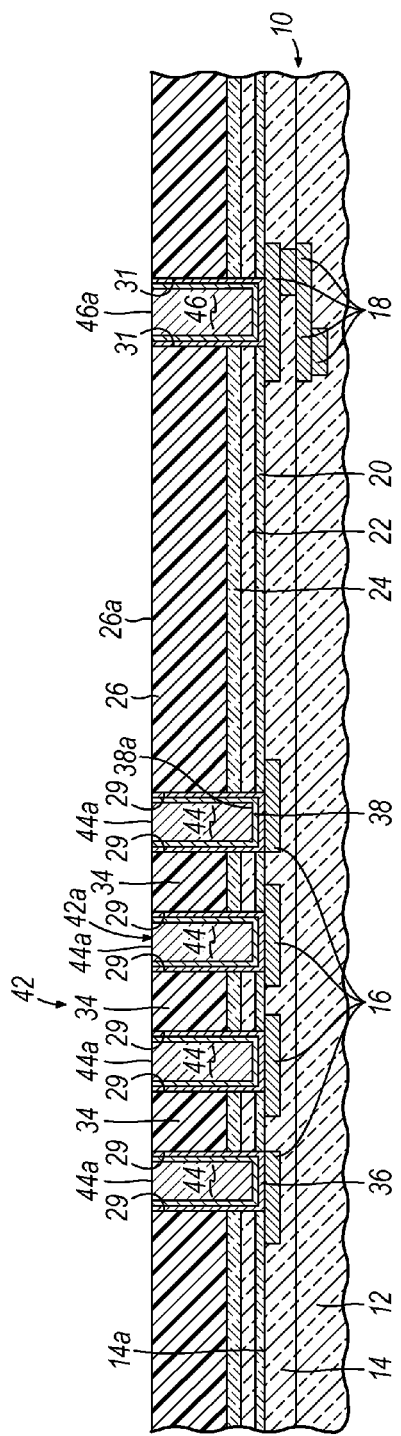
FIG. 4A
FIG. 5

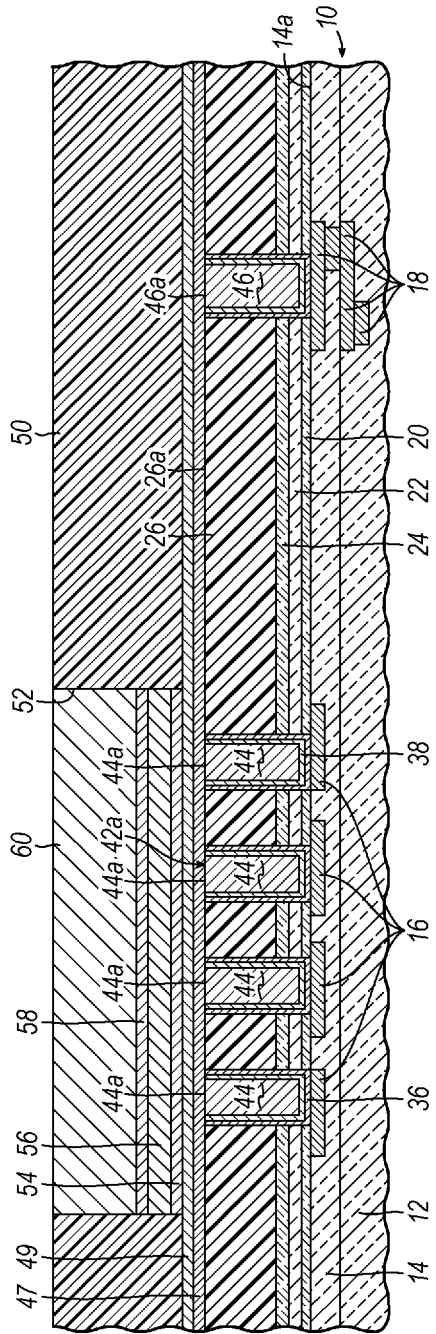
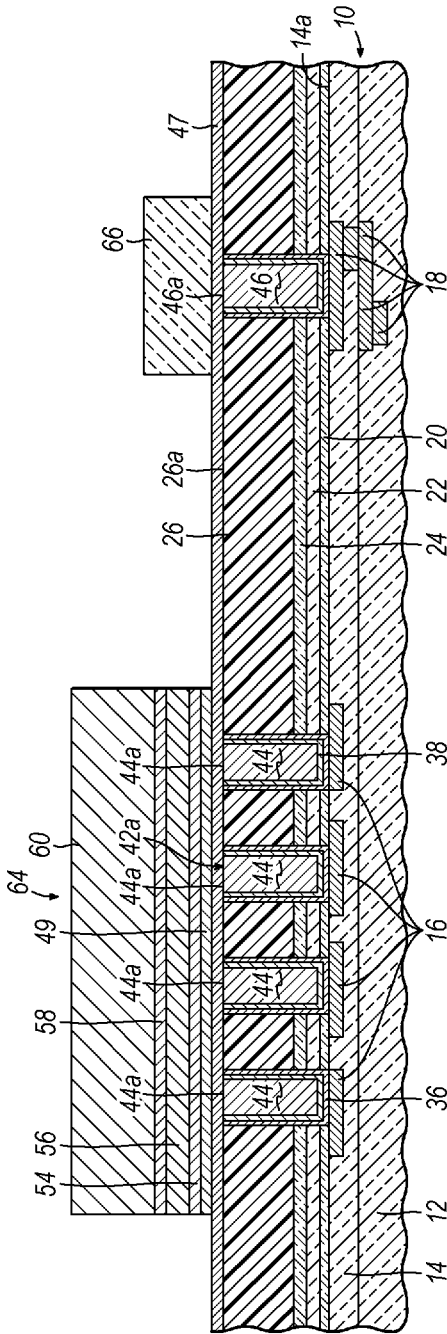
FIG. 6
FIG. 7

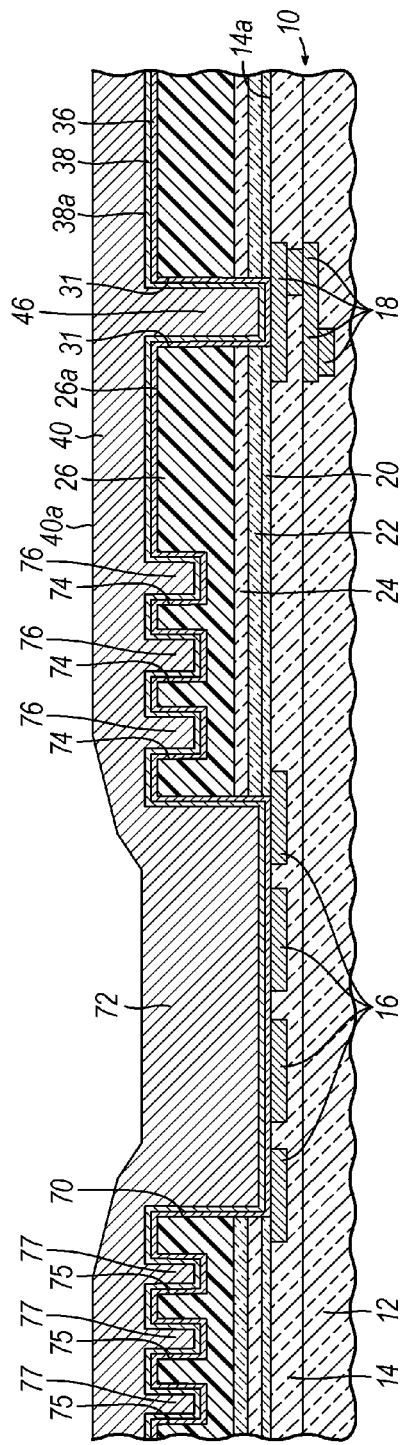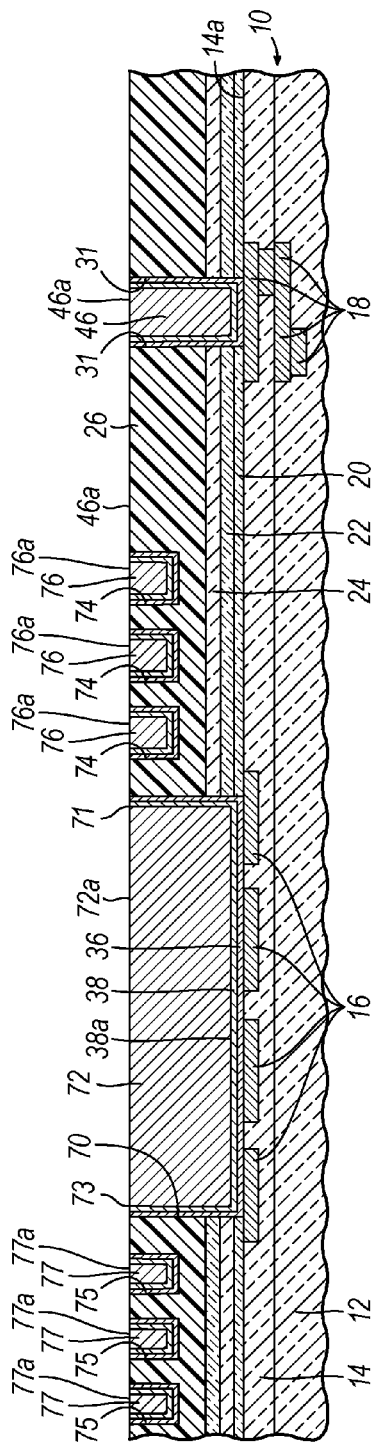

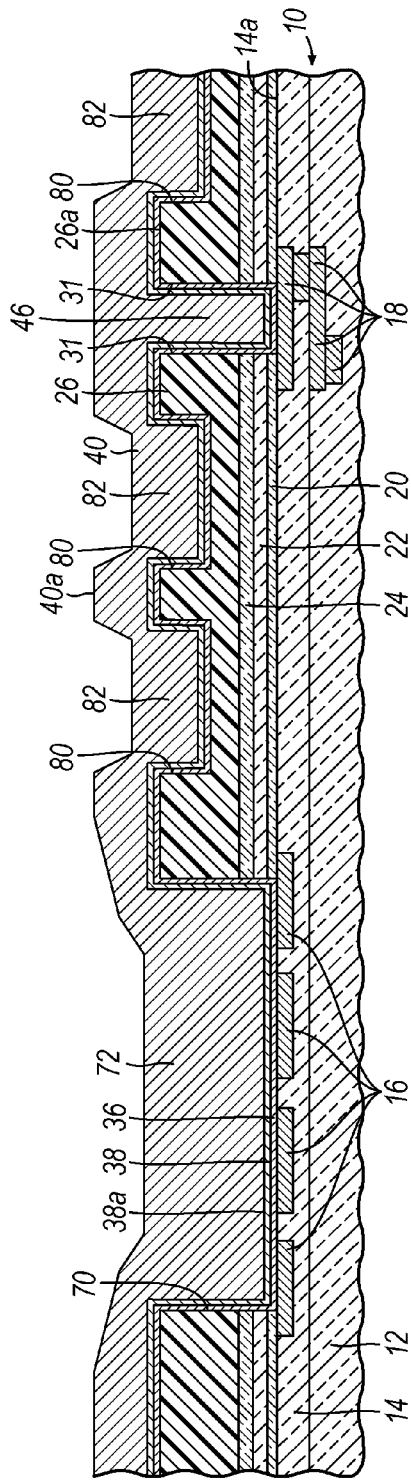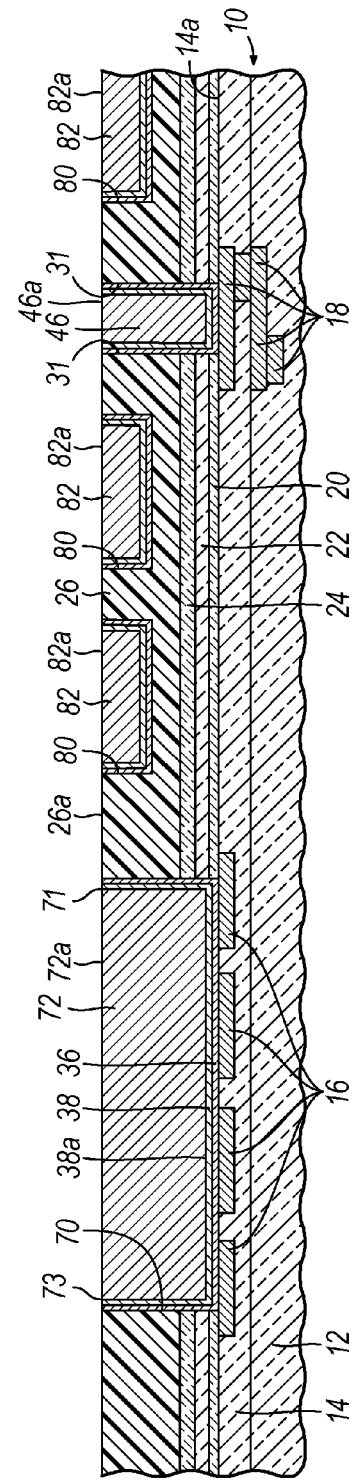

PLUG VIA FORMATION WITH GRID FEATURES IN THE PASSIVATION LAYER

BACKGROUND

The invention relates generally to semiconductor structures and the fabrication of semiconductor chips and, in particular, to solder bump connections and methods for fabricating solder bump connections during the back-end-of-line processing of semiconductor chips.

A chip or die includes integrated circuits formed by front-end-of-line processing using the semiconductor material of a wafer, a local interconnect level formed by middle-end-of-line processing, and stacked metallization levels of an interconnect structure formed by back-end-of line processing. After singulation from the wafer, chips may be packaged and mounted on a circuit board using a controlled collapse chip connection or flip chip process. The solder bumps provide mechanical and electrical connections between features in the last or top metallization level and the circuit board. The solder bumps can be formed using any number of methods, including electroplating, evaporation, printing, and direct placement. The solder bumps establish physical attachment and electrical contact between an array of pads on the chip and a complementary array of pads on a circuit board.

Solder bump connections and fabrication methods are needed that improve on conventional solder bump connections and fabrication methods.

SUMMARY

In an embodiment of the invention, a method is provided for fabricating a solder bump connection. The method includes forming a passivation layer on a dielectric layer, forming via openings extending through the passivation layer from a top surface of the passivation layer to a metal line in the passivation layer, and forming a conductive layer on the top surface of the passivation layer and within each via opening. The method further includes planarizing the passivation layer and the conductive layer to define a plug comprised of sections in the via openings. Each section of the plug is coupled with the metal line.

In an embodiment of the invention, a method is provided for fabricating a solder bump connection. The method includes forming a passivation layer on a dielectric layer, forming a via opening extending through the passivation layer from a top surface of the passivation layer to a metal line in the passivation layer, forming fill openings extending partially through the passivation layer, and forming a conductive layer on the top surface of the passivation layer and within each via opening and each fill opening. The method further includes planarizing the passivation layer and the conductive layer to define a first plug in the via opening and a second plug in each fill opening.

In an embodiment of the invention, a solder bump connection includes a passivation layer, a plurality of via openings extending through the passivation layer, and a plug having a plurality of sections. Each section of the plug is disposed in one of the via openings. A top surface of the passivation layer is coplanar with the first plug, and a width of each via opening is equal to a thickness of the passivation layer.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 1 is a cross-sectional view of a portion of a substrate at an initial stage of a processing method for fabricating a device structure in accordance with an embodiment of the invention.

FIG. 2 is a top view of a portion of FIG. 1 near the via openings.

FIG. 2A is a top view similar to FIG. 2 in accordance with an alternative embodiment of the invention.

FIGS. 3-8 are cross-sectional views of the substrate portion of FIG. 1 at subsequent stages of the processing method.

FIG. 4A is a detailed view of a portion of FIG. 4 near the plug in the via openings.

FIG. 9 is a cross-sectional view similar to FIG. 4 of a processing method for fabricating a device structure in accordance with an alternative embodiment of the invention.

FIG. 10 is a cross-sectional view of the substrate portion of FIG. 9 at a subsequent stage of the processing method.

FIG. 11 is a cross-sectional view similar to FIG. 4 of a processing method for fabricating a device structure in accordance with an alternative embodiment of the invention.

FIG. 12 is a cross-sectional view of the substrate portion of FIG. 11 at a subsequent stage of the processing method.

DETAILED DESCRIPTION

Figure 8:
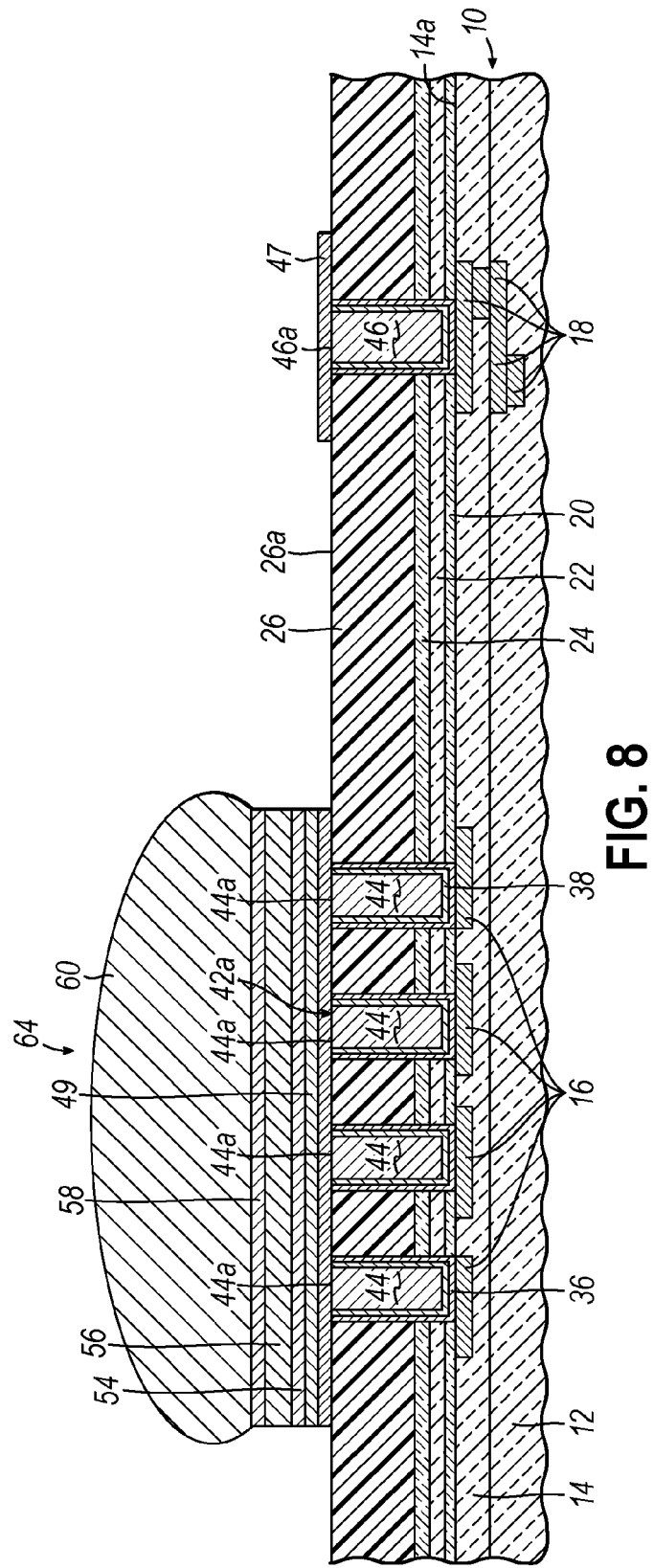

With reference to FIGS. 1, 2 and in accordance with an embodiment of the invention, a topmost metallization level of a back-end-of-line (BEOL) interconnect structure, generally indicated by reference numeral 10, includes a plurality of dielectric layers 12, 14, as well as a metal line 16 and a plurality of metal features 18 embedded as metallization in one or more of the dielectric layers 12, 14. In the representative embodiment, the metal line 16 is adjacent to the metal features 18 and the metal features 18 are near a scribe line for the substrate.

The BEOL interconnect structure is carried on a die or chip from a wafer that has been processed by front-end-of-line processes to fabricate one or more integrated circuits that contain device structures and middle-end-of line processes to fabricate a local interconnect structure. The chip may be formed using a wafer of semiconductor material suitable for integrated circuit fabrication. Typical constructions for the BEOL interconnect structure include multiple metallization levels arranged in a stack. The metallization levels of the BEOL interconnect structure are formed by deposition, lithography, etching, and polishing techniques characteristic of damascene processes conventionally associated with BEOL processing.

The metal line 16 and the metal features 18 may be comprised of copper, aluminum, or an alloy of these materials, and may be formed by a damascene process in the dielectric layers 12, 14. The metal line 16 may be slotted or "cheesed" to limit current crowding. Each of the dielectric layers 12, 14 may be comprised of an organic or inorganic dielectric material that is an electrical insulator with an electrical resistivity at room temperature of greater than $10^{10}$ ($\Omega$-m) is deposited. Candidate inorganic dielectric materials for dielectric layers 12, 14 may include, but are not limited to, silicon dioxide, fluorine-doped silicon glass (FSG), and combinations of these dielectric materials. Alternatively, the dielectric layers 12, 14 may be comprised of a low-k dielectric material characterized by a relative permittivity or dielectric constant smaller than the $SiO_2$ dielectric constant of roughly 3.9. Candidate low-k dielectric materials for dielectric layers 12, 14 include, but are not limited to, porous and nonporous spun-on organic low-k dielectrics (e.g., thermoset polymer resins), porous and nonporous inorganic low-k dielectrics (e.g., organosilicate glasses, hydrogen-enriched silicon oxycarbide (SiCOH), and carbon-doped oxides), and combinations of these and other organic and inorganic dielectrics. Dielectric layers 12, 14 may be deposited by any number of techniques including, but not limited to, sputtering, spin-on application, or CVD.

A layer stack including a capping layer 20 and dielectric layers 22, 24 may be formed on a top surface 14a of dielectric layer 14. The capping layer 20 may be comprised of a material such as $Si_wC_xN_yH_z$, and the dielectric layers may be comprised of silicon nitride ($Si_3N_4$) and silicon dioxide ($SiO_2$).

A passivation layer 26 is formed on the dielectric layer 24. The passivation layer 26 may be comprised of an organic material, such as a polymer like polyimide, that is optionally photosensitive and that is an electrical insulator. The passivation layer 26 may be comprised of photosensitive polyimide (PSPI) or another organic material such as photosensitive polybenzoxazole (PBO). The passivation layer 26 may be prepared by dissolving the polymer in a solvent to form a precursor, dehydrate baking the dielectric layer 24, spreading the precursor with a spin coating process as a coating across the wafer, and then soft-baking the coating to remove solvents.

The stacked layers 22, 24, 26 may be patterned to define features in the form of a plurality of via openings 28 and a crackstop opening 30. Each via opening 28 has sidewalls 29 that extend from a top surface 26a of passivation layer 26 to the metal line 16. The crackstop opening 30 has sidewalls 31 that extend from a top surface 26a of passivation layer 26 to the nearest metal feature 18. To that end, if the organic material is photosensitive, the passivation layer 26 may be patterned by exposure through a photomask in a lithography tool, developed using a solvent, and then cured to crosslink and/or imidize the material. If the organic material is not photosensitive, then the material of the passivation layer 26 may be cured and then patterned using an etch mask and a wet chemical etchant. The patterned passivation layer 26 may provide an etch mask used to pattern layers 22, 24. The process etching the layers 22, 24 may comprise a wet chemical etching process or a dry etching process, such as reactive-ion etching (RIE). The etching process, which may be conducted in a single etching step or multiple steps, relies on one or more etch chemistries to etch the materials of the layers 24, 26 while substantially not etching the dielectric material of the capping layer 20 acting as an etch stop.

The location of the via openings 28 defines an intended position for forming a solder bump connection and is aligned with the location of the metal line 16. The location of the crackstop opening 30 defines an intended position for a crackstop, which serves as a barrier for the propagation of cracks inward from kerf region at an outer edge of the die as might occur, for example, during dicing.

The via openings 28 may have dimensions (e.g., width, $w_1$) and an arrangement that are selected according to various determinative factors. Selection factors for size and pitch may include the type of organic material comprising the passivation layer 26 and the thickness of the passivation layer 26. In the representative embodiment, the via openings 28 may be arranged in linear columns interleaved and alternating with lines 34 comprised of the material of the passivation layer 26. The via openings 28 and lines 34 may be formed with respective widths and respective pitches that are constant in one direction (FIG. 2) to define a grid. Width selection may be coordinated with the selection of the thickness of the conductive layer that is subsequently deposited to fill the via openings 28.

In an embodiment, the lines 34 may be characterized by a width, $w_2$, which may be equal to the width, $w_1$, of the via openings 28. If the sidewalls 29 are tapered, then the respective widths may vary slightly over the height of the sidewalls 29. In one embodiment, the width, $w_1$, of each via opening 28 and the width $w_2$ of each line 34 may be nominally equal to the thickness, t, of the cured passivation layer 26. Adjacent via openings 28 have a spacing or pitch given by the sum of the width, $w_1$, and the width $w_2$. Adjacent lines 34 also have a spacing or pitch given by the sum of the width, $w_1$, and the width $w_2$. The height of the lines 34 is equal to the thickness, $t_3$, of the passivation layer 26.

Alternatively, the via openings 28 and lines 34 may be arranged in pattern having a combination of columns and rows (FIG. 2A). In these different arrangements, the via openings 28 and lines 34 may have widths that obey the same or similar rules as in FIG. 2.

The capping layer 20 is removed from within the via openings 28 and the crackstop opening 30. The removal of the capping layer 20 can be performed, for example, using a sputter etch with energetic noble gas ions (e.g., positively-charged argon ions) or a RIE. The passivation layer 26 may be cleaned, for example, using a chromic-phosphoric acid solution.

With reference to FIG. 3 in which like reference numerals refer to like features in FIG. 1 and at a subsequent fabrication stage, a layer stack including an adhesion layer 36 and a seed layer 38 is formed that covers the sidewalls 29 of the via openings 28 and the metal line 16 at the base of the via openings 30, that covers the sidewalls 31 of the crackstop opening 30, and the top surface 26a of the passivation layer 26. The adhesion layer 36 may directly contact the seed layer 38 so that layers 36, 38 are in physical and electrical contact. The adhesion layer 36 is in physical and electrical contact with the metal line 16 and with the metal features 18, and may also act as a diffusion barrier in addition to promoting the adhesion of the seed layer 38 with the passivation layer 26 and/or the metal line 16.

The adhesion layer 36 may be comprised of titanium (Ti), titanium nitride (TiN), tantalum (Ta), tantalum nitride (TaN), or a multilayer combination of these materials (e.g., a bilayer of TaN/Ta). In one embodiment, seed layer 38 may be comprised of copper (Cu), such as elemental Cu or co-deposited chromium-copper (Cr—Cu). The layers 36, 38 of the layer stack may be serially deposited using, for example, physical vapor deposition (PVD) that provides a conformal layer thickness.

With reference to FIGS. 4, 4A in which like reference numerals refer to like features in FIG. 3 and at a subsequent fabrication stage, a conductive layer 40 is formed that fills and adopts the geometrical shape and the pattern of the via openings 28 and the geometrical shape of the crackstop opening 30. The conductive layer 40 may be comprised of Cu, although other suitable low-resistivity metals and metal alloys may be selected and may be deposited by a deposition process, such as an electrochemical plating process like electroplating. In an electrochemical plating process, the seed layer 38 operates as a catalyst to nucleate the formation of the conductor constituting conductive layer 40. The material in seed layer 38 may be subsumed during the deposition process, such that the seed layer 38 may become continuous with or blend into conductive layer 40.

A plug 42 is formed by sections 44 of the conductive layer 40 that are positioned inside the via openings 28. Each of the sections 44 of plug 42 is positioned in one of the via openings 28. Collectively, the sections 44 constitute the plug 42 and are physically and electrically coupled with the metal line 16 that underlies the sections 44. A plug 46 is formed by the conductive layer 40 inside the crackstop opening 30.

As best shown in FIG. 4A, each section 44 of plug 42 is comprised of the conductor of the conductive layer 40. For each section 44, growth fronts for portions 45a, 45b advance laterally inward from the seed layer 38 on the sidewalls 29 of each via opening 28 toward a center plane 48 and a growth front for a portion 45c advances vertically upward from the seed layer 38 on the metal line 16. The growth fronts for the different portions 45a-c converge to provide a slightly divoted topography that may be symmetrical with respect to the center plane 48.

The conductive layer 40 on the top surface 26a has a thickness, $t_1$, and the portions 45a, 45b of each section 44 have a thickness, $t_2$. To accommodate the over-polishing needed to ensure planarity, the thickness, $t_1$, of the conductive layer 40 may be enhanced by a margin for over-polishing. In one embodiment, the over-polishing margin may be less than or equal twenty-five (25) percent of the thickness, $t_1$. Because of the over-polishing margin, the thickness, $t_1$, of the conductive layer 40 on the top surface 26a may be greater than the thickness, $t_2$, of the conductive layer 40 within the via openings 26.

The use of the multiple via openings permit the thickness, $t_1$, of the conductive layer 40 on the top surface 26a of the passivation layer 26 to be optimized. Specifically, due to the presence of the multiple via openings 28, the thickness of the conductive layer 40 may be reduced in comparison with constructions featuring a single via opening. The thickness, $t_1$, of the conductive layer 40 on the top surface 26a is greater than one-half of the width, $w_1$, of the via openings 26, but less than the depth, d, of the via openings 28. The thickness, $t_1$, of the conductive layer 40 on the top surface 26a is increased due to over-polish margin, which may be less than or equal to 25% of the thickness, $t_1$. In standard processes that include a single wide via opening extending through the passivation layer at the location of the solder bump connection, the conductive layer thickness is always greater than the depth of the single wide via opening for complete filling and is also significantly less than one-half of the width of the single wide via opening. The multiple converging growth fronts for the conductor of the conductive layer 40 that is filling each via opening 28 permits the conductive layer 40 to be deposited with a thickness, $t_1$, that is less than the depth, d, of the via openings 28.

The width, $w_1$, of the via openings 28 may be made as narrow as possible given the constraints on photolithography imposed by the material of the passivation layer 26. In one embodiment, the width, $w_1$, of the via openings 28 may be equal to the thickness, $t_3$, of the passivation layer 26 in its cured condition. This relationship may be applied in combination with the relationship between the thickness, $t_1$, of the conductive layer 40 on the top surface 26a and the width, $w_1$, of the via openings 28 to yield a relationship that the thickness, $t_1$, of the conductive layer 40 on the top surface 26a is greater than one-half of the thickness of the passivation layer 26 but less than the thickness, $t_3$, of the passivation layer 26.

With reference to FIG. 5 in which like reference numerals refer to like features in FIG. 4 and at a subsequent fabrication stage, a polishing process may be used to planarize the sections 44 of plug 42 and the plug 46 in the crackstop opening 30 relative to the top surface 26a of the passivation layer 26. At the conclusion of the polishing process, the top surfaces 42a, 44a, 46a are coplanar with the top surface 26a of the passivation layer 26 and the field of the top surface 26a surrounding the plugs 42, 46 is free of the conductor from the conductive layer 40, the seed layer 38, and the adhesion layer 36. The plug 42 in is direct physical and electrical contact with the top surface 38a of the seed layer 38 inside the openings 28. Alternatively, if the seed layer 38 is considered to be subsumed into the material of the plug 42, the plug 42 and the adhesion layer 36 may be considered to be in physical and electrical contact inside the openings 28.

In one embodiment, a chemical-mechanical polishing (CMP) process may be used to remove surface topography and provide the flattening. The CMP process combines abrasion and chemical erosion to remove the overburden of conductor from conductive layer 40. The CMP process also removes the adhesion layer 36 and seed layer 38 from the top surface 26a of the passivation layer 26.

The via openings 28 operate to reduce the thickness of the conductive layer 40 as discussed above, which in turn reduces the contact of the polish pad with the top surface 26a of the passivation layer 26 during the polishing process that provides the planarization. The reduced contact may decrease the amount of surface damage (features such as scratches and gouges) and other defects created in top surface 26a of the passivation layer 26. The reduced damage to the top surface 26a may improve its visual appearance and may improve the interfacial reliability with contacting packaging materials, like underfill. The reduction in surface damage may also reduce the amount of residual metal (e.g., Cu or TiW) embedded in the features comprising the surface damage.

The thickness of the conductive layer 40 deposited on the top surface 26a of the passivation layer 26 is a primary factor influencing the over-polish after endpoint (i.e., the nominal point of surface clearance after initial surface contact). The amount of over-polish after endpoint increases with increasing thickness of the conductive layer 40 on the top surface 26a and, therefore, can be reduced by reducing the thickness of the conductive layer 40 on the top surface 26a. The amount of over-polish after endpoint may be equal to a constant (i.e., a percentage less than or equal to 25%) times the thickness, $t_1$, of the conductive layer 40 on the top surface 26a. As a numerical example, a fifty (50) percent reduction in the thickness of conductive layer 40 on the top surface 26a may reduce the amount of overpolish by approximately fifty (50) percent.

The top surface 26a of passivation layer 26, the top surface 42a of plug 42, and the top surface 46a of plug 46 may be cleaned after polishing is performed. For example, the top surfaces 26a, 42a, 44a may be sputter cleaned using energetic positive argon ions.

With reference to FIG. 6 in which like reference numerals refer to like features in FIG. 5 and at a subsequent fabrication stage, a layer stack including an adhesion layer 47 and a seed layer 49 is formed that covers the planarized the top surfaces 26a, 42a, 44a. The adhesion layer 47 may directly contact the seed layer 49 so that layers 47, 49 are in physical and electrical contact. The layers 47, 49 are components of Ball Limiting Metallurgy (BLM) or Under Bump Metallurgy (UBM). The adhesion layer 47 may be comprised of one or more refractory metals that are thermally stable during BEOL processes and that strongly adhere with the subsequently-formed pedestal, and may also act as a diffusion barrier. The adhesion layer 47 may be comprised of, for example, titanium tungsten (TiW), and the seed layer 49 may be comprised of Cu or Cr—Cu. Layers 47, 49 of the layer stack may be serially deposited using, for example, PVD.

A patterned plating mask 50 is formed by applying a layer of a photo-sensitive organic material, exposing the photosensitive organic material in the layer to radiation through a photomask, and developing the exposed photosensitive organic material to form an opening 52 in the layer at a location that spatially coincides with the plug 42. In one embodiment, the plating mask 50 may be a photoactive polymer resist, such as RISTON® photopolymer resist. The opening 52 in the plating mask 50 determines the shape, thickness, and location of a pedestal and solder bump. The dimensions of the opening 52 in the plating mask 50 may match a specification for solder bumping and, in particular, may match the specification for C4 solder bumping. In particular, the size of the opening 52 is a factor in determining dimensions (length and width) of the pedestal and solder bump and the thickness of the plating mask 50 is a factor in determining the height of the pedestal and solder bump.

A pedestal comprised of barrier layers 54, 58 and a conductor layer 56 disposed between the barrier layers 54, 58 is formed within the opening 52 in the plating mask 50. The barrier layer 54 may be formed on a top surface of the seed layer 49 overlying the plug 42. The conductor layer 56, which is comprised of a different material, such as Cu, is formed on a top surface of the barrier layer 54. The barrier layer 58 may be formed on a top surface of the conductor layer 56. The barrier layers 54, 58 and conductor layer 56 do not form on the plating mask 50. In a representative embodiment, the barrier layers 54, 58 may be comprised of a metal, such as nickel (Ni) or a Ni alloy (e.g., NiCo), deposited by an electrochemical plating process (e.g., electroplating). Similarly, the conductor layer 56 may also be deposited by an electrochemical plating process, such as electroplating.

A solder bump 60 is formed on the top surface of the barrier layer 58. The solder bump 60 may be comprised of solder having a conventional lead-free (Pb-free) composition, which may include tin (Sn) as the primary elemental component. In a representative embodiment, the solder bump 60 may be formed by electroplating using an appropriate plating solution, anodes, and direct current. The barrier layers 54, 58, conductor layer 56, plug 42, adhesion layer 47, and adhesion layer 36 provide a conductive path between the metal line 16 and the solder bump 60. The barrier layer 58 may protect the material (e.g., Cu) of the underlying plug 42 against consumption during reflow processes from reactions with the solder bump 60.

With reference to FIG. 7 in which like reference numerals refer to like features in FIG. 6 and at a subsequent fabrication stage, the plating mask 50 is stripped or otherwise removed from the top surface of the seed layer 49. For example, a stripping solution may be used if the plating mask 50 is comprised of a photoactive polymer resist, such as RISTON®. A solder bump connection 64 is defined by the structures between the metal line 16 and the solder bump 60. During BEOL processing, the solder bump connection 64 is replicated across at least a portion of the surface area of the wafer.

Field regions of the seed layer 49 are removed from the areas on the top surface 26a of passivation layer 26 that are not covered by the solder bump connection 64. The etching process may stop on the adhesion layer 47. A mask 66 may be applied to the adhesion layer 47 at the location of the plug 46 inside of the crackstop opening 30.

With reference to FIG. 8 in which like reference numerals refer to like features in FIG. 7 and at a subsequent fabrication stage, the field regions of the adhesion layer 47 may then be removed using wet chemical etching processes. The mask 66 protects a section of the adhesion layer 47, which covers the plug 46 with a lateral margin to overlap on the top surface 26a of the passivation layer 26. In an alternative embodiment, the mask 66 may be omitted from the process flow.

The solder bump 60 is reflowed and a flip-chip assembly process may thereafter be performed. The chip carrying the solder bump connection 64 is inverted and aligned relative to a laminate substrate. The solder bumps, including solder bump 60, are bonded to the matching pads on the laminate substrate using a reflow process. The temperature of the reflow process is dependent upon solder composition but is typically in a range of 200° C. to 300° C. Eventually, the solder bump 60 and solder bump connection 64 generate an electrical pathway for transferring data signals to and from the chip to an external device, such as a computing system, or an electrical pathway for powering integrated circuits on the chip.

With reference to FIG. 9 in which like reference numerals refer to like features in FIG. 4 and in accordance with an alternative embodiment of the invention, a via opening 70 may be formed in the passivation layer 26 and filled with a plug 72 when the conductor of the conductive layer 40 is applied. Fill openings 74 are formed adjacent to an outer edge 71 of the via opening 70 and fill openings 75 are formed adjacent to another outer edge 73 of the via opening 70. One or the other of the sets of fill openings 74, 75 may be omitted. The fill openings 74, 75 may be formed using a half-tone mask so that the fill openings 74, 75 are shallower than via opening 70 and extend only partially through the thickness of the passivation layer 26. A top surface 40a of the conductive layer 40 is raised relative to the top surface 26a of the passivation layer 26, as in FIGS. 4, 4A. However, the transition at the edges 71, 73 differs from the transition apparent in FIGS. 4, 4A in that the conductive layer 40 is thinner proximate to the edges 71, 73 than on the top surface 26a away from the edges 71, 73.

The interior of each fill opening 74, 75 is coated by the adhesion layer 36 and seed layer 38 so that, when the conductive layer 40 is formed, a small plug 76 forms inside of each fill opening 74 and a small plug 77 forms inside of each fill opening 75. The proximity of the fill openings 74, 75 to the edges 71, 73 reduces the thickness of the conductive layer 40 needed to fill the via opening 70 and thereby form plug 72. The reduced thickness of the conductive layer 40 proximate to the edges 71, 73 in turn reduces the overburden of conductor originating from conductive layer 40 on the top surface 26a of the passivation layer 26 as a smaller thickness is required in comparison with a structure lacking the fill openings 74, 75.

With reference to FIG. 10 in which like reference numerals refer to like features in FIG. 11 and at a subsequent fabrication stage, the conductive layer 40 is polished as described above in conjunction with FIG. 5. After polishing, the top surface 72a of plug 72 and the top surfaces 76a, 77a of the plugs 76, 77 are coplanar with the surface 26a of passivation layer 26. The plugs 76, 77 constitute fill material and are not electrically coupled with the integrated circuits on the wafer, the solder bump connection 64, etc. The reduced thickness of the conductive layer 40 arising from the presence of the conductor-filled fill openings 74, 75 operates to reduce the amount of polishing required to remove the overburden of conductor from the top surface 26a and to reduce damage imparted to the top surface 26a from polishing as described above. The process flow follows as described in connection with FIGS. 5-8 to complete the solder bump connection 64.

With reference to FIG. 11 in which like reference numerals refer to like features in FIG. 4 and in accordance with an alternative embodiment of the invention, a plurality of fill openings 80 are formed between the via opening 70 and the crackstop opening 30, as well as outside of the crackstop opening 30. The fill openings 80, which may have the shape and form of trenches, may be formed using a half-tone mask so that the openings 80 are shallower than via opening 70 and extend only partially through the thickness of the passivation layer 26. The openings 80 may have a width that is greater than or equal two times the thickness of the conductive layer 40. The transition in the thickness of the conductive layer 40 at the edges 71, 73 of the via plug 72 is similar to the transition apparent in FIG. 9. The top surface 40a of the conductive layer 40 is raised relative to the top surface 26a of the passivation layer 26 and the filling of the openings 80 introduces a surface topography with localized area aligned with the openings 80.

The interior of each opening 80 is coated by the adhesion layer 36 and seed layer 38 so that a plug 82 forms inside of each opening 80 when the conductive layer 40 is formed. The plugs 82 constitute fill material from the conductive layer 40 that remains in the openings 80 after planarization. Only a partially thickness of the conductive layer 40 is removed at the location of the plugs 82. The plugs 82 are not electrically coupled with the integrated circuits on the wafer, the solder bump connection 64, etc. As a result of the presence of the fill openings 80, the thickness of the conductive layer 40 on the top surface 26a is reduced, which reduces the conductor overburden from conductive layer 40 on the top surface 26a of the passivation layer 26.

With reference to FIG. 12 in which like reference numerals refer to like features in FIG. 11 and at a subsequent fabrication stage, the conductive layer 40 is polished as described above in conjunction with FIG. 5. After polishing, the top surface 82a of each plug 82 is coplanar with the surface 26a of passivation layer 26. The plugs 82 constitute dummy metal fill that are not electrically connected to any of integrated circuits on the wafer or with the solder bump connection 64. The reduced thickness of the conductive layer 40 arising from the presence of the conductor-filled fill openings 80 operates to reduce the amount of polishing required to remove the overburden of conductor from the top surface 26a and to reduce damage imparted to the top surface 26a from polishing as described above. The process flow follows as described in connection with FIGS. 5-8 to complete the solder bump connection 64.

The embodiments described with respect to FIGS. 9, 10 and FIGS. 11, 12 may be used in combination with each other, or individually in combination with the embodiments described with respect to FIGS. 1-8.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. The chip may be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a solder bump connection, the method comprising:
    forming a passivation layer on a dielectric layer;
    forming a plurality of via openings extending through the passivation layer from a top surface of the passivation layer to a metal line in the dielectric layer;
    forming a conductive layer on the top surface of the passivation layer and within each via opening;
    planarizing the passivation layer and the conductive layer to define a first plug comprised of a plurality of sections in the via openings that are each coupled with the metal line;
    forming one or more Under Bump Metallurgy (UBM) layers on the sections of the first plug; and
    forming a solder bump that is coupled with the metal line by the sections of the first plug.

2. The method of claim 1 wherein each via opening has a width and a depth relative to the top surface of the passivation layer, the conductive layer on the top surface of the passivation layer has a thickness, and the width ranges from one-half of the thickness of the conductive layer to less than the depth of the via opening.

3. The method of claim 2 wherein the passivation layer has a thickness, and the width of each via opening is equal to the thickness of the passivation layer.

4. The method of claim 1 wherein forming one or more Under Bump Metallurgy (UBM) layers on the sections of the first plug comprises:
    before the conductive layer is formed, forming a seed layer covering the via openings, the metal line, and the top surface of the passivation layer,
    wherein the seed layer is configured to promote the formation of the conductive layer.

5. The method of claim 4 wherein forming one or more Under Bump Metallurgy (UBM) layers on the sections of the first plug further comprises:
    before the seed layer is formed, forming an adhesion layer covering the via opening, the metal line, and the top surface of the passivation layer.

6. The method of claim 5 wherein planarizing the passivation layer and the conductive layer comprises:

removing the seed layer and the adhesion layer from the top surface of the passivation layer so that a top surface of the first plug is coplanar with the top surface of the passivation layer.

7. The method of claim 4 wherein forming the conductive layer comprises:
   electrodepositing a conductor on the seed layer to form the conductive layer.

8. The method of claim 1 further comprising:
   forming a crackstop opening extending through the passivation layer,
   wherein a second plug comprised of a conductor of the conductive layer is disposed in the crackstop opening after the passivation layer and the conductive layer are planarized.

9. The method of claim 8 further comprising:
   forming an adhesion layer on the top surface of the passivation layer, the first plug, and the second plug;
   forming a pedestal on the adhesion layer at the location of the first plug;
   after the pedestal is formed, applying a mask on the adhesion layer at a location overlying the crackstop opening; and
   removing unmasked portions of the adhesion layer from the top surface of the passivation layer so that a section of the adhesion layer covers the second plug.

10. The method of claim 1 further comprising:
    before the solder bump is formed, forming a pedestal on the UBM layers,
    wherein the pedestal is located between the solder bump and the UBM layers.

11. The method of claim 1 wherein the via openings are arranged in a grid when formed.

12. A method comprising:
    forming a passivation layer on a dielectric layer;
    forming a via opening extending through the passivation layer from a top surface of the passivation layer to a metal line in the dielectric layer;
    forming a plurality of fill openings extending partially through the passivation layer and located adjacent to an edge of the via opening;
    forming a conductive layer on the top surface of the passivation layer and within each via opening and each fill opening; and
    planarizing the passivation layer and the conductive layer to define a first plug in the via opening that is coupled with the metal line and a plurality of second plugs in the fill openings,
    wherein the first plug participates in forming a solder bump connection, and the second plugs are not electrically coupled with the solder bump connection, and
    wherein the passivation layer is comprised of an organic material.

13. The method of claim 12 wherein each fill opening has a width that is greater than or equal to two times a thickness of the conductive layer.

14. The method of claim 12 wherein the organic material is comprised of polyimide.

15. A method of fabricating a solder bump connection, the method comprising:
    forming a passivation layer on a dielectric layer;
    forming a plurality of via openings extending through the passivation layer from a top surface of the passivation layer to a metal line in the dielectric layer;
    forming a conductive layer on the top surface of the passivation layer and within each via opening; and
    planarizing the passivation layer and the conductive layer to define a first plug comprised of a plurality of sections in the via openings that are each coupled with the metal line,
    wherein the passivation layer is comprised of an organic material.

16. The method of claim 15 wherein the organic material is comprised of photosensitive polyimide.

17. The method of claim 15 further comprising:
    forming a solder bump that is coupled with the metal line by the sections of the first plug.

\* \* \* \* \*